United States Patent
Schmid et al.

(10) Patent No.: US 9,520,570 B2
(45) Date of Patent: Dec. 13, 2016

(54) ORGANIC ELECTRONIC DEVICE AND METHOD FOR THE PRODUCTION THEREOF

(75) Inventors: Guenter Schmid, Hemhofen (DE); Jan Hauke Wemken, Nuremberg (DE); Andreas Kanitz, Hoechstadt (DE)

(73) Assignee: OSRAM OLED GmbH, Regensburg (DE)

( * ) Notice: Subject to any disclaimer, the term of this patent is extended or adjusted under 35 U.S.C. 154(b) by 995 days.

(21) Appl. No.: 13/499,542

(22) PCT Filed: Sep. 30, 2010

(86) PCT No.: PCT/EP2010/064592
§ 371 (c)(1),
(2), (4) Date: Jul. 27, 2012

(87) PCT Pub. No.: WO2011/039323
PCT Pub. Date: Apr. 7, 2011

(65) Prior Publication Data
US 2012/0286253 A1  Nov. 15, 2012

(30) Foreign Application Priority Data
Sep. 30, 2009 (DE) .................. 10 2009 047 880

(51) Int. Cl.
*H01L 51/54* (2006.01)
*H01L 51/00* (2006.01)
*H01L 51/05* (2006.01)
*H01L 51/42* (2006.01)
*H01L 51/50* (2006.01)

(52) U.S. Cl.
CPC ....... *H01L 51/0067* (2013.01); *H01L 51/0072* (2013.01); *H01L 51/5076* (2013.01); *H01L 51/0512* (2013.01); *H01L 51/42* (2013.01); *H01L 51/5092* (2013.01)

(58) Field of Classification Search
None
See application file for complete search history.

(56) References Cited

U.S. PATENT DOCUMENTS

| 2001/0009690 A1* | 7/2001 | Choong et al. ............. 427/66 |
| 2004/0126619 A1 | 7/2004 | Nishita |
| 2010/0112471 A1 | 5/2010 | Kanitz et al. |

FOREIGN PATENT DOCUMENTS

| CN | 1700829 | 11/2005 |
| DE | 10 2006 053 644 | 6/2008 |
| JP | 2004-335137 | 11/2004 |
| JP | 2004 335137 | 11/2004 |
| JP | 2006-045314 | 2/2006 |
| JP | 2007-226043 | 9/2007 |
| JP | 2007-531308 | 11/2007 |
| JP | 2008-222624 | 9/2008 |
| JP | 2009-194211 | 8/2009 |
| WO | WO 2005/104188 | 11/2005 |
| WO | WO 2008/058929 | 5/2008 |
| WO | WO 2009/122958 | 10/2009 |

OTHER PUBLICATIONS

Machine translation of JP2004-335137. Year of publication: 2004.*
Gassmann, et al. "The Li3PO4/Al Bilayer: An Efficient Cathode for Organic Light Emitting Devices", Journal of Applied Physics, American Institute of Physics, vol. 105, No. 8, 2009, pp. 84513-1-84513-6.
Diez, et al. "Highly Stable Charge Generation Layers Using Caesium Phosphate as N-Dopants and Inserting Interlayers", Journal of Applied Physics, 111 (2012), pp. 103107-1-103107-7.
Wemken, et al. "Low-Cost Caesium Phosphate as N-Dopant for Organic Light-Emitting Diodes", Journal of Applied Physics, 111 (2012) pp. 074502-1-074502-5.
Chan Ting-Shan et al. "Synthesis, Crystal Structure, and Luminescence Properties of a Novel Green-Yellow Emitting Phosphor $LiZn_{1-x}PO_4:Mn_x$ for Light Emitting Diodes", Chemistry of Materials, American Chemical Society, vol. 20, No. 4, pp. 1215-1217, Jan. 4, 2008.

* cited by examiner

*Primary Examiner* — Andrew K Bohaty
(74) *Attorney, Agent, or Firm* — Cozen O'Connor

(57) ABSTRACT

An organic electronic device comprising: a substrate; (1), a first electrode; (2), a second electrode (4); and an electron-conducting region (3A, 3B) which is arranged between the first and; second electrodes and comprises an organic matrix material (3B) and a salt (3A) which comprises a metal cation and an at least trivalent anion.

12 Claims, 11 Drawing Sheets

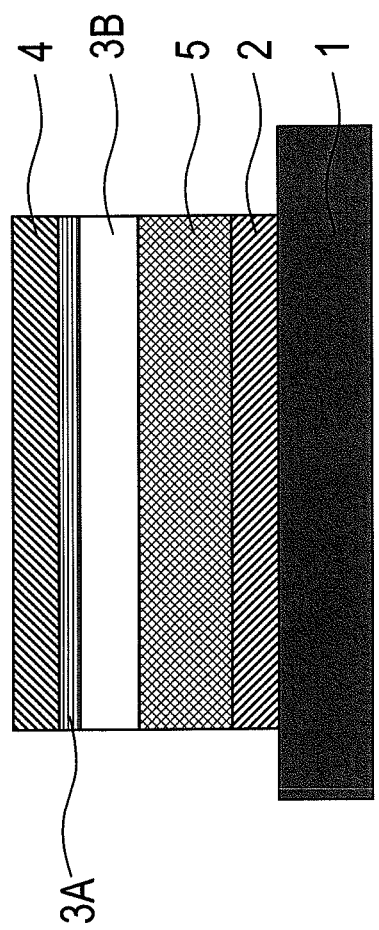

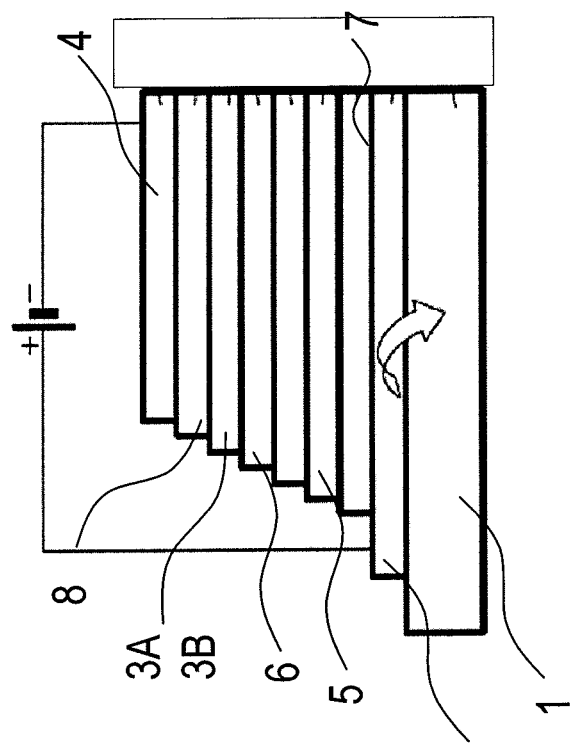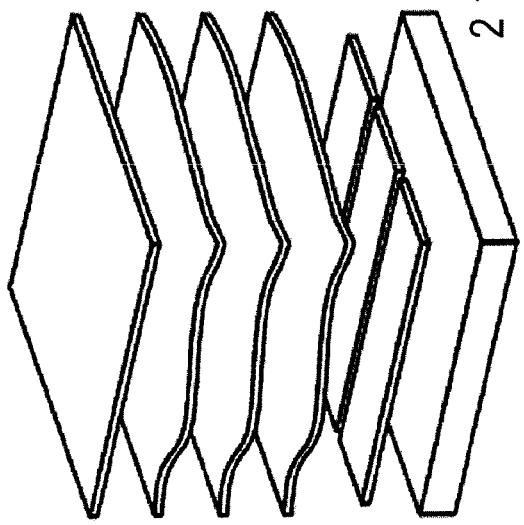

Fig 8
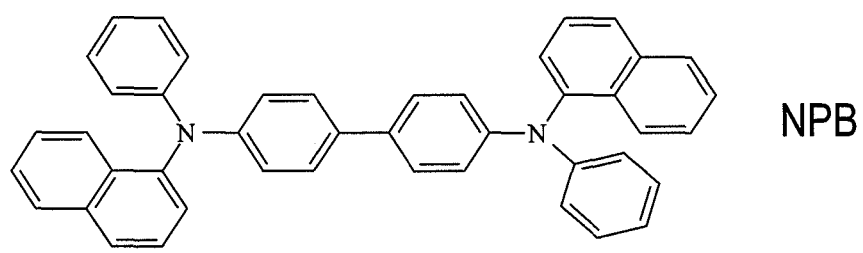 NPB
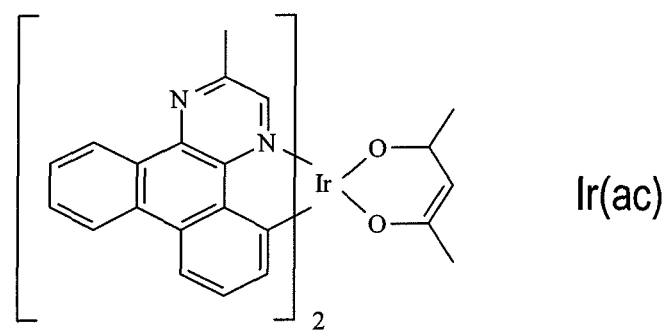 Ir(ac)
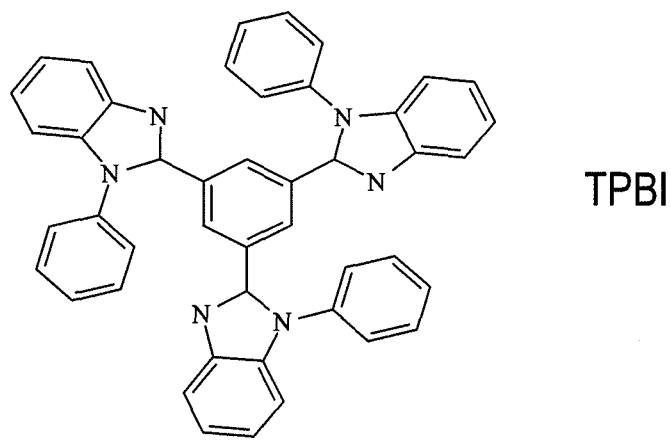 TPBI

ORGANIC ELECTRONIC DEVICE AND METHOD FOR THE PRODUCTION THEREOF

This is a U.S. National Phase Application under 35 USC 371 of International Application PCT/EP2010/064592 filed on Sep. 30, 2010.

This application claims the priority of German Application No. 10 2009 047 880.9 filed Sep. 30, 2009, the entire content of which is hereby incorporated by reference.

This patent application claims the priority of German patent application DE 102009047880.9 filed Sep. 30, 2009, the disclosure content of which is hereby incorporated by reference.

FIELD OF THE INVENTION

The present invention relates to organic electronic components, for example organic light-emitting devices, organic photosensitive devices, for example photovoltaic cells or photodetectors or organic transistors, for example organic field-effect transistors.

A widespread problem in organic electronic devices is, in the case of electroluminescent devices, for example, that of ensuring sufficient charge carrier injection through the anode and cathode to the at least one organic electroluminescent layer. In an OLED, the recombination of injected electrons and holes forms excitons which cause the organic electroluminescent layer to luminesce. The luminance, the efficiency and the lifetime of the OLEDs all depend greatly on the exciton density formed in the electroluminescent layer by charge carrier injection, and also on the quality of the charge carrier injection.

Analogously to organic light-emitting diodes (OLEDs), problems also occur in organic photosensitive devices, for example photovoltaic cells or photodetectors, with the charge carrier transport of the electrons and holes formed by means of exciton separation in the photoactive layer to the electrodes. Charge carrier transport also plays a major role in organic electronic devices with no optoelectronic application, for example in organic transistors such as organic field-effect transistors, and is one of the determining factors for the electrical properties.

The publication "Elucidation of the electron injection mechanism of evaporated caesium carbonate cathode interlayer for organic light emitting diodes" in the journal Applied Physics Letters (90, 2007) describes electron injection layers in OLEDs, which are formed by vacuum deposition of cesium carbonate and cause an increased efficiency of the OLED. The authors of this publication arrive at the conclusion that cesium carbonate decomposes in the course of vacuum deposition to metallic cesium which forms a thin layer which then serves as an electron injection layer. Other authors discuss a decomposition of the cesium carbonate to $Cs_2O$ and $CO_2$. The outcome of this is that the anion of the salt used for vacuum deposition, i.e. carbonate, should not be involved in the electron injection.

SUMMARY OF THE INVENTION

One object of the invention is to provide an organic electronic device in which electron transport is improved.

One embodiment of the invention comprises an organic electronic device comprising
a substrate,
a first electrode,
a second electrode, and
an electron-conducting region which is arranged between the first and second electrodes and comprises
an organic matrix material and a salt which comprises
a metal action and
an at least trivalent anion.

In contrast to the publication already cited above in the introductory part of the description, the inventors have found that the nature of the anion of a metal salt is involved in charge carrier transport in an organic electronic device. The inventors assume that the anion of the metal salt which is used to produce the organic electronic device is incorporated into this device, and the valency, i.e. the charge of the anions, is of significance in the electron transport. Compared to the cesium carbonate used in the prior art, which has only a valency of 2, i.e. a double negative charge, it is possible in the case of an at least trivalent anion (triple negative charge) to observe an improvement in the electrical properties of the organic electronic device.

In one embodiment of an organic electronic device according to the invention, the electron-conducting region has at least two layers, of which a first layer comprises the matrix material and a second layer in contact with the first layer comprises the salt, this second layer, as what is called an electron injection layer, preferably being arranged closer to the electrode connected as the cathode than the first layer comprising the matrix material (see, for example, FIG. 2).

In another preferred embodiment of the invention, the electron-conducting region may have an electron-conducting layer which comprises the organic matrix material into which the salt has been introduced as an n-dopant. In this embodiment, the improvements in the electrical properties are particularly distinctive.

It is possible to use the electron-conducting layer comprising the organic matrix material into which the salt has been introduced as an n-dopant, for example, as a charge carrier transport layer which transports electrones from one region to another region of an organic electronic device. In addition, the electron-conducting layer may also be part of what is called a charge generation layer (CGL), in which, for example, a doped hole transport layer and a doped electron transport layer are present and may be separated by a thin intermediate layer of metal, for example, or else are in direct contact with one another. Such a CGL may, for example, connect different OLED subcells with one another in an OLED tandem cell.

The inventors have found that salts with at least trivalent anions, i.e., for example, tri- or tetravalent anions, as dopants in layers comprising matrix materials have advantages over dopants composed of salts with only divalent anions, for example cesium carbonate. For example, it is possible to use salts with at least trivalent anions as a dopant in electron-transporting matrix materials in concentrations up to five times lower than salts with divalent anions. In addition, current-voltage characteristics show that the improvement in conductivity on doping with salts with at least trivalent anions is at least one order of magnitude better than in the case of salts having only divalent anions (see, for example, a comparison of FIGS. 5 and 6). Due to the lower dopant concentration in the case of salts with at least trivalent anions, another relatively common result is an improved color impression of the electronic devices in the switched-off state compared to salts with divalent anions. For example, doping of the BCP matrix material with cesium carbonate leads to a bluish color impression of the doped electron transport layer in the switched-off state, whereas doping with cesium phosphate, for example, as an example of a salt with an at least trivalent anion, leaves a more neutral color impression in the switched-off state of the organic electronic device.

In the case that the salt has been introduced as an n-dopant into the layer comprising the matrix material, it is advantageous when the n-dopant is present in a concentration of 1 to 50% by volume, preferably 5 to 15% by volume, in the organic matrix material. Percentage by volume concentrations within this range lead to a particularly marked improvement in the electrical properties, for example in the current-voltage characteristics. This is particularly marked in the case of use of BCP as the matrix material.

The metal action of the salt may be selected from:
monovalent metal cations,
alkaline earth metal cations,
zirconium cations or combinations thereof.

The inventors have found that particularly monovalent metal cations, for example alkali metal cations such as Rb(I) and Cs(I), or Ag(I), Cu(I), Tl(I) and alkaline earth metal cations are good dopants in combination with at least trivalent anions. These salts of trivalent anions can also be vaporized without decomposition.

The at least trivalent anion may be selected, for example, from
phosphate anions $PO_4^{3-}$,
vanadate anions $VO_4^{3-}$,
silicate anions $SiO_4^{4-}$,
at least trivalent anionic polyvalent organic anions, for example the trianion of 1,3,5-benzenetricarboxylic acid or the tetraanion of naphthalenetetracarboxylic acid or at least trivalent organic acids, for example the tetraanion of methanetetracarboxylic acid or the trianion of methanetricarboxylic acid.

The corresponding cesium salts of methanetetracarboxylic acid and of methanetricarboxylic acid have the following structures:

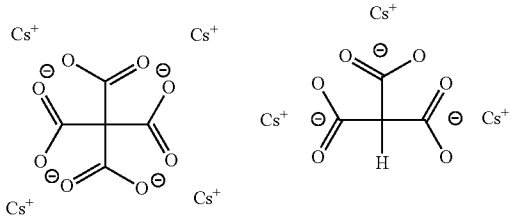

The organic anions may, for example, also have aromatic rings with nitrogen atoms. All abovementioned anions and cations can also be used in combination.

The inventors have found that the abovementioned cations and anions, particularly phosphate, have positive effects on the electrical properties of an organic electronic device when they are used as a dopant in electron-transporting layers.

In the case that the salt is used as an n-dopant in a layer comprising the organic matrix material, the undissociated salt can, for example, be coordinated to the organic matrix material via the metal action (see, for example, FIG. 4A). Depending on their valency, the anions can act as chelate ligands, in which case, for example, a trivalent anion such as the phosphate anion may be tridentate and thus have three metal cations as coordination partners, in the case of cesium phosphate, for example, Cs(I).

It is additionally conceivable that the dopant, for example in a covaporization of the matrix material and the salt, forms a coordination compound between the metal action of the salt and the organic matrix material as a ligand upon dissociation of the salt, in which case the anion is then intercalated into this matrix (see, for example, FIG. 4B). Particularly advantageously, in the case of a complex between the action of the salt and the organic matrix material as a ligand, it is possible for a three-dimensional conductive network to form through coordinative bonds.

In a further embodiment of an organic electronic device according to the invention, the organic matrix material comprises a heterocyclic nitrogen containing compound. This compound may comprise, for example, pyridine base structures, for example 2,9-dimethyl-4,7-diphenyl-1,10-phenanthroline (BCP). Heterocyclic nitrogen containing compounds are particularly suitable for serving as ligands for the metal cations of the n-dopant salt and are generally also good electron conductors.

In a further embodiment of the invention, the organic matrix material comprises a repeating unit with the following general formula:

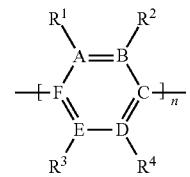

where
the ring members A to F are each independently C or N, with the proviso that a maximum of two nitrogen atoms may be present,
n is an integer from 2 to 8, where the free valences of the ends of the chains of the repeat units may each independently be saturated by H, methyl, phenyl, 2-pyridyl, 3-pyridyl or 4-pyridyl,
$R^1$ to $R^4$ may each independently be H, methyl, phenyl, 2-pyridyl, 3-pyridyl or 4-pyridyl, and/or $R^1$ and $R^2$ or $R^3$ and $R^4$ may together form butadiene or azabutadiene units, such that a fused 6-membered ring system is formed and the repeating units may be bonded by ethylene or azomethine units between the nth and (n+1)th ring to form phenanthrene or azaphenanthrene units.

Such oligopyridyl- and/or oligopyridinylarenes are particularly suitable since they coordinate well to the dopants and are disclosed, for example, in PCT application WO2008/058929, to which reference is made in respect of these materials. The charge carrier transport properties of the matrix materials mentioned can be controlled via the number of nitrogen atoms in the ring system.

The organic matrix material may be selected from the following specific compounds and combinations thereof:

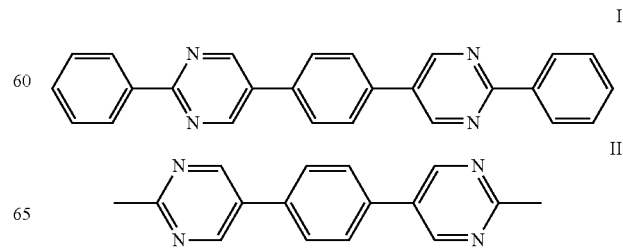

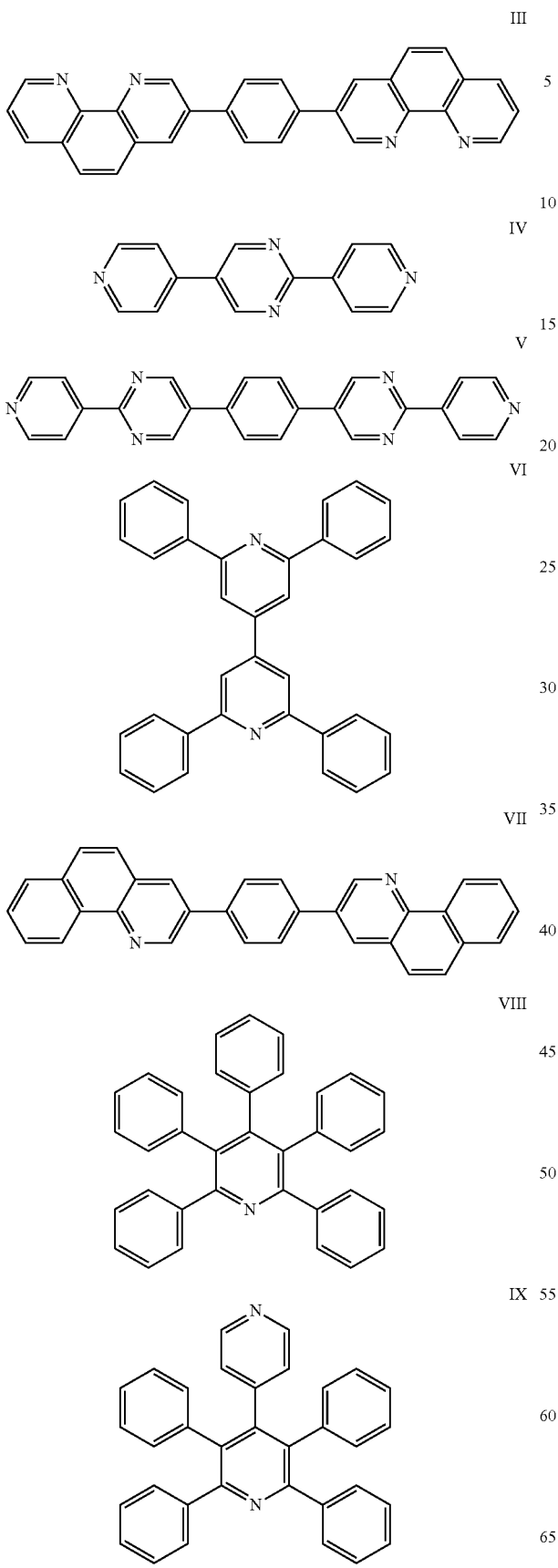
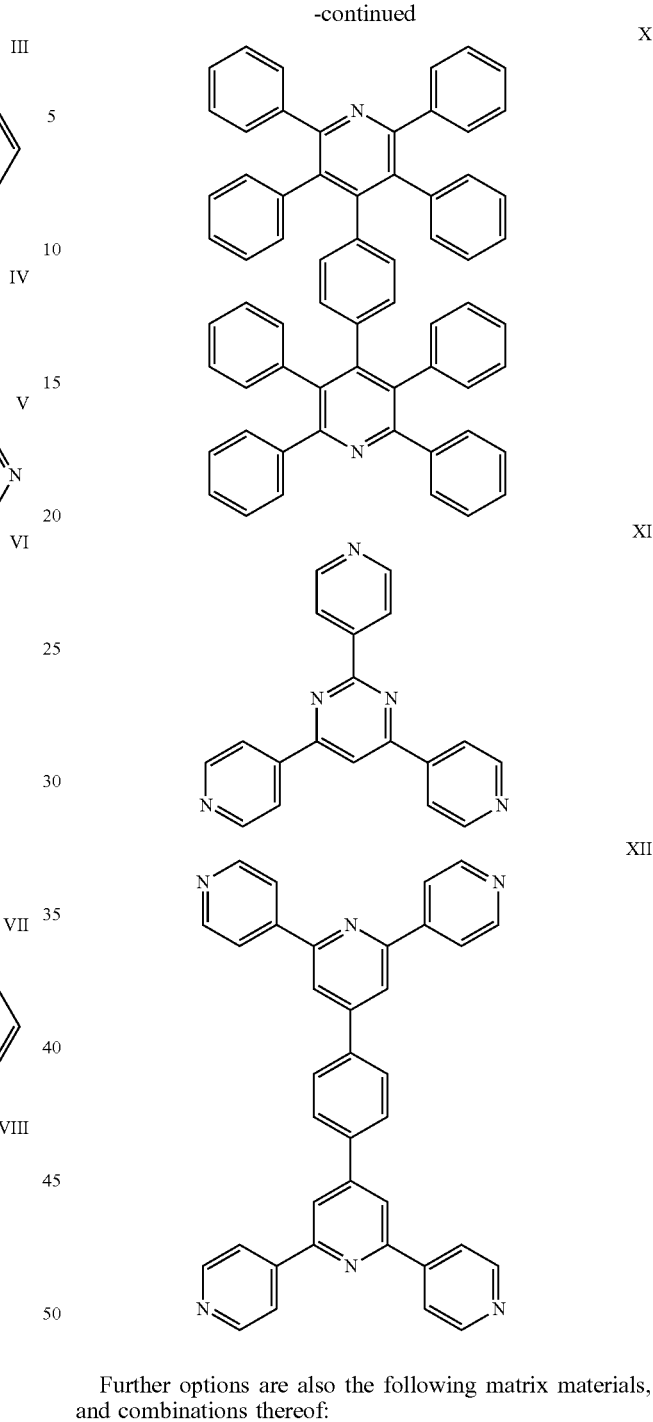

Further options are also the following matrix materials, and combinations thereof:
2,2',2''-(1,3,5-benzenetriyl)tris(1-phenyl-1H-benzimidazole),
2-(4-biphenylyl)-5-(4-tert-butylphenyl)-1,3,4-oxadiazole,
2,9-dimethyl-4,7-diphenyl-1,10-phenanthroline (BCP),
8-hydroxyquinolinatolithium,
4-(naphthalen-1-yl)-3,5-diphenyl-4H-1,2,4-triazole,
1,3-bis[2-(2,2'-bipyridin-6-yl)-1,3,4-oxadiazo-5-yl]benzene,
4,7-diphenyl-1,10-phenanthroline,
3-(4-biphenylyl)-4-phenyl-5-tert-butylphenyl-1,2,4-triazole,
bis(2-methyl-8-quinolinato)-4-(phenylphenolato)aluminum,
6,6'-bis[5-biphenyl-4-yl)-1,3,4-oxadiazo-2-yl]-2,2'-bipyridyl, 2-phenyl-9,10-di(naphthalen-2-yl)anthracene,
2,7-bis[2-(2,2'-bipyridin-6-yl)-1,3,4-oxadiazo-5-yl]
9,9-dimethylfluorene,
1,3-bis[2-(4-tert-butylphenyl)-1,3,4-oxadiazo-5-yl)benzene,
2-(naphthalen-2-yl)-4,7-diphenyl-1,10-phenanthroline,
2,9-bis(naphthalen-2-yl)-4,7-diphenyl-1,10-phenanthroline,
tris(2,4,6-trimethyl-3-(pyridin-3-yl)phenyl)borane,
1-methyl-2-(4-(naphthalen-2-yl)phenyl)-1H-imidazo[4,5-f]
  [1,10]-phenanthroline,
siloles with silacyclopentadiene units.

Preferred salts for dopants are particularly alkali metal salts of the phosphates, for example cesium phosphate.

A further embodiment of the invention provides an organic electronic device which is configured as an organic electroluminescent diode (OLED) and further comprises an organic electroluminescent layer between the electron-conducting region and one of the electrodes. The electroluminescent (EL) layer is arranged in the layer stack of the OLED such that the electron-conducting region is between the EL layer and the electrode connected as the cathode. In such a configuration of an OLED, particularly good electron transport from the cathode to the organic EL layer is ensured.

In addition, the organic electronic device of the present invention may also be configured as an organic photosensitive device, in which case an organic photoactive layer, for example a bulk heterojunction, is present between an n-conducting and a p-conducting material. The n-conducting material may, for example, be fullerene $C_{60}$ which, for example, has been mixed with p-conducting polymers such as polyparaphenylenevinylene or has been shaped in separate layers applied one on top of another. In the case of such an organic photosensitive device, the inventive electron-conducting region is then likewise arranged between the organic photoactive layer and the electrode connected as the cathode, and thus enables particularly efficient transport of the electrons formed by incident light from excitons away from the organic photoactive layer.

A further example of an organic electronic device is an organic transistor, for example a field-effect transistor, in which an organic semiconductor which may, for example, comprise an electron-conducting layer in accordance with the invention with the salt as a dopant may be present (see, for example, FIG. 9). Such an electron-conducting layer may, for example, be in contact with the electrodes of the transistor in order to achieve an improvement in the injection of charge carriers. Particular preference is given to using the electron-conducting layer in n-channel transistors.

An aspect of the invention is directed to a process for producing an organic electronic device, comprising the process steps of:
A) providing a substrate with a first electrode,
B) applying an electron-conducting region to the first electrode,
C) applying a second electrode in electrically conductive contact with the electron-conducting layer,
  wherein the electron-conducting layer is applied by vaporizing an organic matrix material and a salt which comprises
  metal cations and
  an at least trivalent anion.

More preferably, in process step B), the electron-conducting region is obtained by means of vapor deposition, more preferably by means of physical vapor deposition (PVD). In the case that the electron-conducting layer is a layer of an organic matrix material with the salt as an n-dopant, covaporization of the salt and of the organic matrix material is preferred. The salts with the at least trivalent anion are easy to vaporize, and frequently just a few residues, if any, are observed. Due to the high, at least triple negative charge present in the anion, such salts should be difficult to vaporize. The inventors, however, have found that it is surprisingly possible, for example, to vaporize the cesium phosphate salt by electrically heated molybdenum boats practically residue-free. The vaporization properties of cesium phosphate are similar to those of the lithium fluoride salt, but this only has a single negatively charged fluoride anion. Cesium carbonate, which is known from the prior art, in contrast, forms non-vaporizable residues under the same conditions.

Another aspect of the invention is directed to an electron-conducting composition comprising:
  an electron-conducting matrix material, which may comprise, for example, the compounds already mentioned above, and
  a salt as an n-dopant, said salt comprising
  an at least trivalent anion and
  a cation.

BRIEF DESCRIPTION OF THE DRAWINGS

FIG. 2 is a schematic cross section of a further embodiment of an organic electronic device according to the invention, in which the organic matrix material and the salt are arranged in separate layers.

FIGS. 3A and 3B show, in perspective view and in cross-sectional view in greater detail, an organic electroluminescent device according to an embodiment of the invention.

FIG. 8 shows the chemical structures of possible charge carrier transport materials and electroluminescent materials which can be used in inventive OLEDs.

DETAILED DESCRIPTION OF THE DRAWINGS

Figure 1:
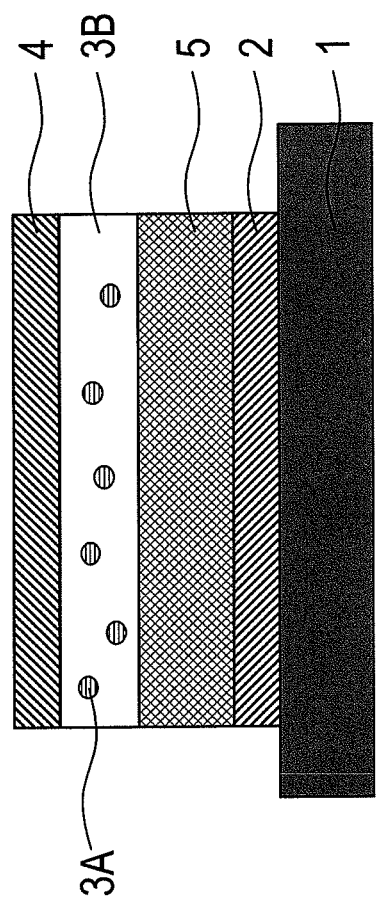
FIG. 1 shows, in schematic cross section, an embodiment of an organic electronic device according to the invention, which may be configured either as an organic photosensitive device or as an organic electroluminescent device (OLED), the salt having been introduced as an n-dopant into a matrix of the organic matrix material.

FIG. 1 shows, in cross section, an organic electronic device with a substrate 1, a first electrode 2 and a second electrode with reference numeral 4, and an organic functional layer 5 which, in the case of an OLED, comprises an organic electroluminescent (EL) layer, or, in the case of an organic photosensitive device, includes a photoactive layer. Between the organic functional layer 5 and the second electrode 4 connected as a cathode is an electron-conducting region which comprises an organic matrix material 3B and a salt 3A with an at least trivalent anion, which has been introduced as an n-dopant into layer 3B of the organic matrix material. Due to the electron-conducting region 3A and 3B, such an Organic electronic device has improved charge transport capacity for electrons between the cathode 4 and the organic functional layer 5. In the case of an OLED, electron transport from the cathode 4 toward the organic electroluminescent layer 5 is improved in such a device, whereas the transport of electrons formed in the photoactive layer 5 from the photoactive layer 5 towards the cathode 4 is improved in the case of an organic photoactive layer.

The schematic cross section shown in FIG. 2 shows an alternative embodiment to FIG. 1 for the organic electronic device. In contrast to FIG. 1, the electron-conducting region is configured here as two separate layers, namely a layer comprising the matrix material 3B and a separate layer 3A comprising the salt with the at least trivalent anion. Otherwise, all other layers are unchanged from the representation in FIG. 1. In the devices shown in FIG. 1 and FIG. 2, additional layers may be present.

FIGS. 3A and 3B show, in perspective view and in cross section, a further embodiment of an inventive OLED in which, in addition to the organic electroluminescent layer 5 and the inventive electron-conducting layer 3A, 3B, further layers are also present, for example a hole-transporting layer 9, a hole injection layer 7, a hole blocking layer 6 and an electron injection layer 8, which ensure effective charge carrier transport from the anode 2 and the cathode 4 to the electroluminescent layer.

Figure 4A:
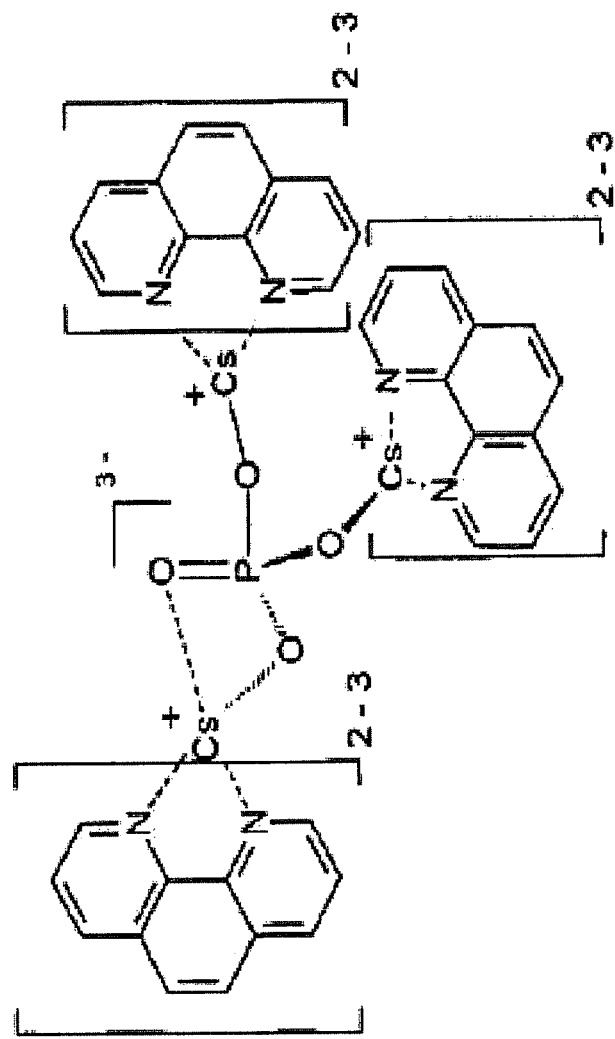
FIGS. 4A and 4B show different coordination options between the salt with the at least trivalent anion and the organic matrix material, in the case that the salt has been introduced as an n-dopant into the organic matrix material.

FIG. 4A shows one possible coordination between the salt with the at least trivalent anion and a matrix material in the case that the salt is cesium phosphate and the matrix material is BCP (2,9-dimethyl-4,7-diphenyl-1,10-phenanthroline), the methyl and phenyl substituents of BCP not being shown for reasons of clarity. It can be inferred from FIG. 4A that the cesium phosphate salt is undissociated and is intercalated into the organic matrix material, the salt coordinating BCP as a ligand via the cesium cations. In this case, the trivalent phosphate anion which binds three cesium cations acts as a tridentate chelate ligand. Each cesium action of the cesium phosphate salt can also coordinate two to three BCP molecules as ligands.

Figure 4B:
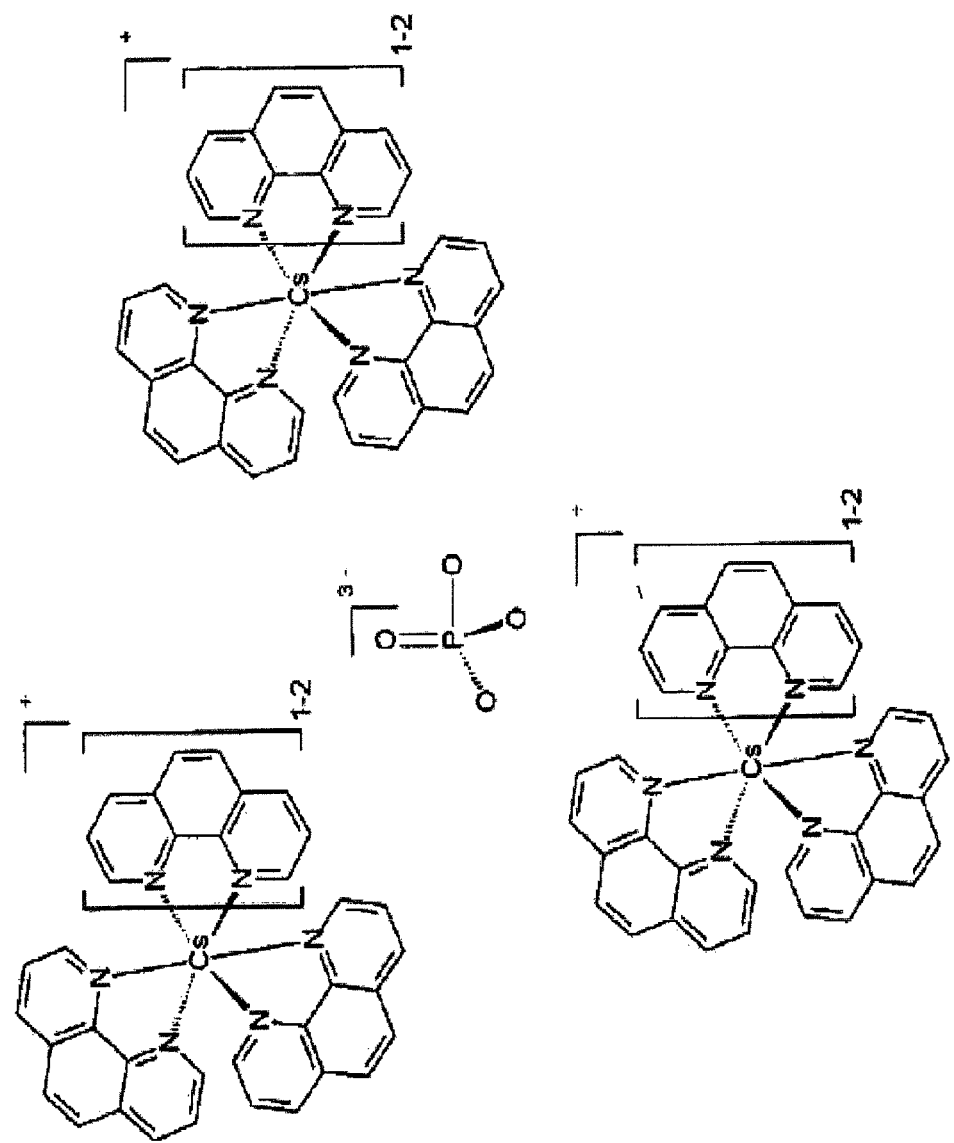

FIG. 4B shows a further possible coordination of cesium phosphate as a salt with BCP as an organic matrix material. In this case, the cesium phosphate is present in dissociated form with separate anions and cations, and coordination compounds form between the cesium action and BCP, the phosphate anion being intercalated into the matrix to balance the charge for reasons of neutrality.

Figure 5:
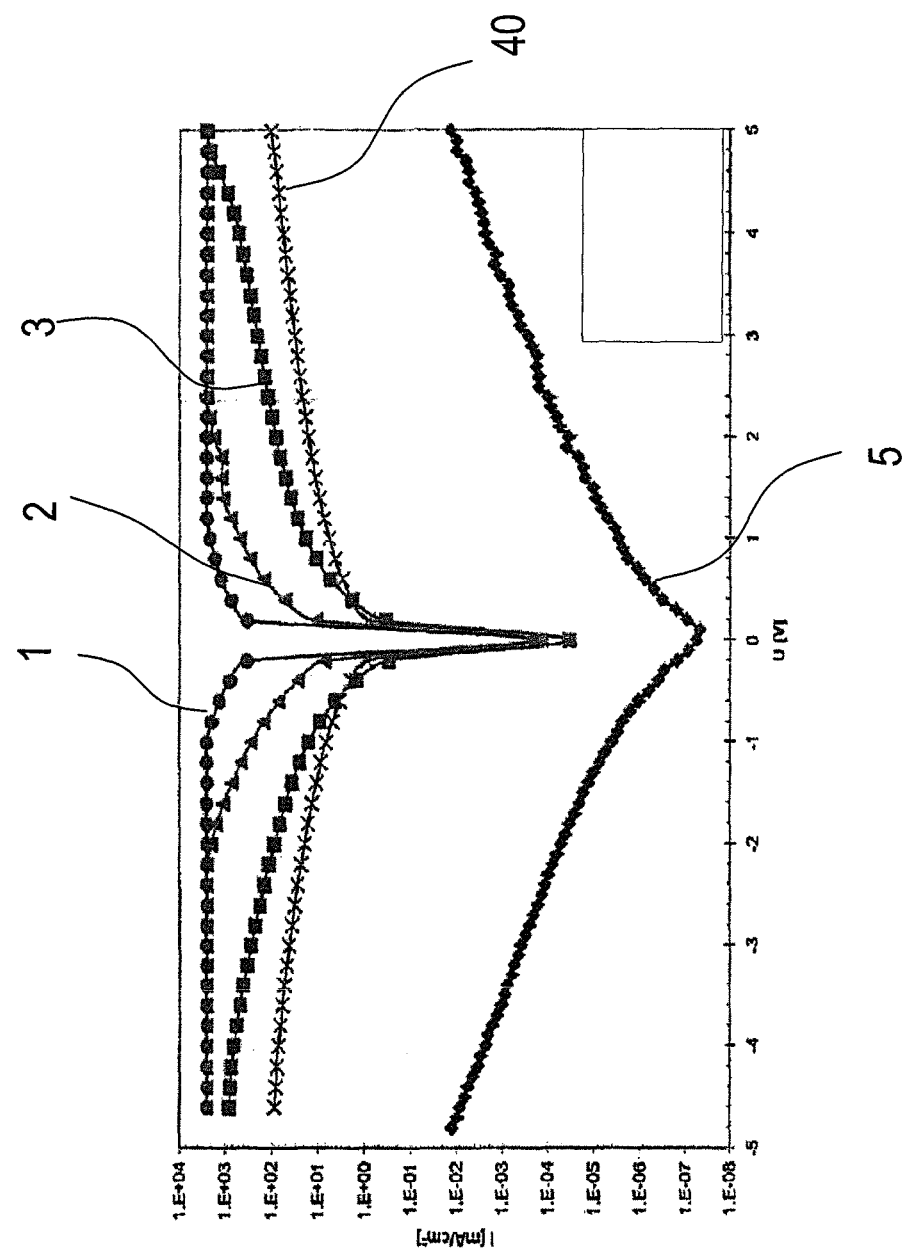
FIG. 5 shows the current-voltage characteristics of an OLED in accordance with an embodiment of the invention with different dopant concentrations of cesium phosphate in BCP as a matrix material.

FIG. 5 shows the change in the current-voltage characteristics of BCP layers arranged between an ITO anode and an aluminum cathode in the event of changes in the dopant concentration of cesium phosphate as a doping n-dopant relative to BCP as the matrix material. The layer arrangements were produced by depositing a 200 nm-thick BCP layer by thermal vaporization onto a glass substrate structured with ITO (indium tin oxide), with vaporization rates of cesium phosphate relative to the vaporization rate of BCP of 5%, 10%, 15% and 30% (covaporization of BCP and cesium phosphate). Aluminum was vapor-deposited as a cathode onto the doped BCP layer. The current-voltage characteristic labeled with reference numeral 50 indicates the I-U behavior of a pure undoped BCP layer arranged between the ITO anode and the aluminum cathode. The current-voltage characteristic provided with reference numeral 30 indicates the I-U characteristics of a BCP layer containing 5% by volume of cesium phosphate as an n-dopant. Compared to this, the current-voltage characteristic changes according to current-voltage characteristic 10 in the event of an increase in the dopant concentration to 10% by volume, and according to current-voltage characteristic 20 in the event of an increase to 15% by volume. It is observed that, in the case of a dopant concentration of 30% by volume, the electrical properties deteriorate slightly (current-voltage designated 40). It is observed that, within a concentration range from 5% by volume to 15% by volume, a good improvement in the current-voltage behavior can be observed compared to undoped BCP, while this worsens again at 30%.

Figure 6:
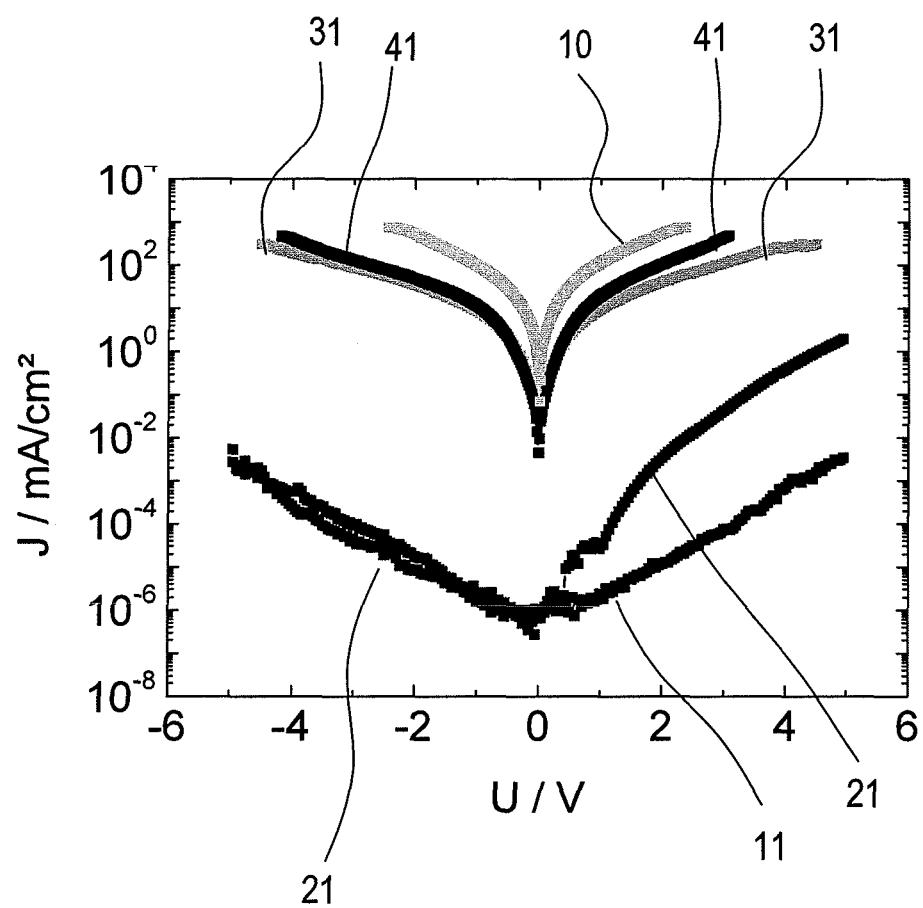
FIG. 6 shows, as a comparison thereto, the current-voltage characteristics of OLEDs in which the cesium carbonate dopant known from the prior art has been used in different concentrations.

FIG. 6 shows the current-voltage characteristics of a BCP layer which is arranged between an ITO anode layer and an aluminum cathode layer and has been doped with different % by volume concentrations of $Cs_2CO_3$. The current-voltage characteristic labeled 11 shows the current-voltage behavior of a pure BCP layer, while the line labeled 21 indicates doping with 1% by volume of cesium carbonate. The current-voltage characteristic labeled 31 was measured when doping with 10% by volume of cesium carbonate was present, and current-voltage characteristic 41 was obtained in the case of doping with 20% by volume of cesium carbonate. In the case of 1:1 doping with 50% by volume of cesium carbonate, the I-U characteristic labeled 10 was obtained.

A comparison of the current-voltage characteristics of FIGS. 5 and 6 shows clearly that, in the case of use of cesium phosphate $Cs_3PO_4$ as a dopant, distinct improvements in electrical behavior are observed compared to cesium carbonate $Cs_2CO_3$. First, comparable current-voltage curves can be achieved with a cesium phosphate concentration five times lower compared to cesium carbonate. In the case of doping with cesium phosphate, the result is frequently a current-voltage characteristic improved by an order of magnitude of 1 compared to cesium carbonate as a dopant. In addition, the BCP layers doped with high cesium carbonate concentrations are blue in color in the switched-off state, while the doped BCP layers leave a more neutral color impression in the case of cesium phosphate due to the lower dopant concentrations. This is particularly important for the color impression of OLEDs in the switched-off state, which should be of maximum color neutrality. FIGS. 5 and 6 thus show clearly that, through the use of a dopant salt with a trivalent anion, distinct improvements in electrical properties are possible compared to the use of a dopant salt with a divalent anion.

Figure 7:
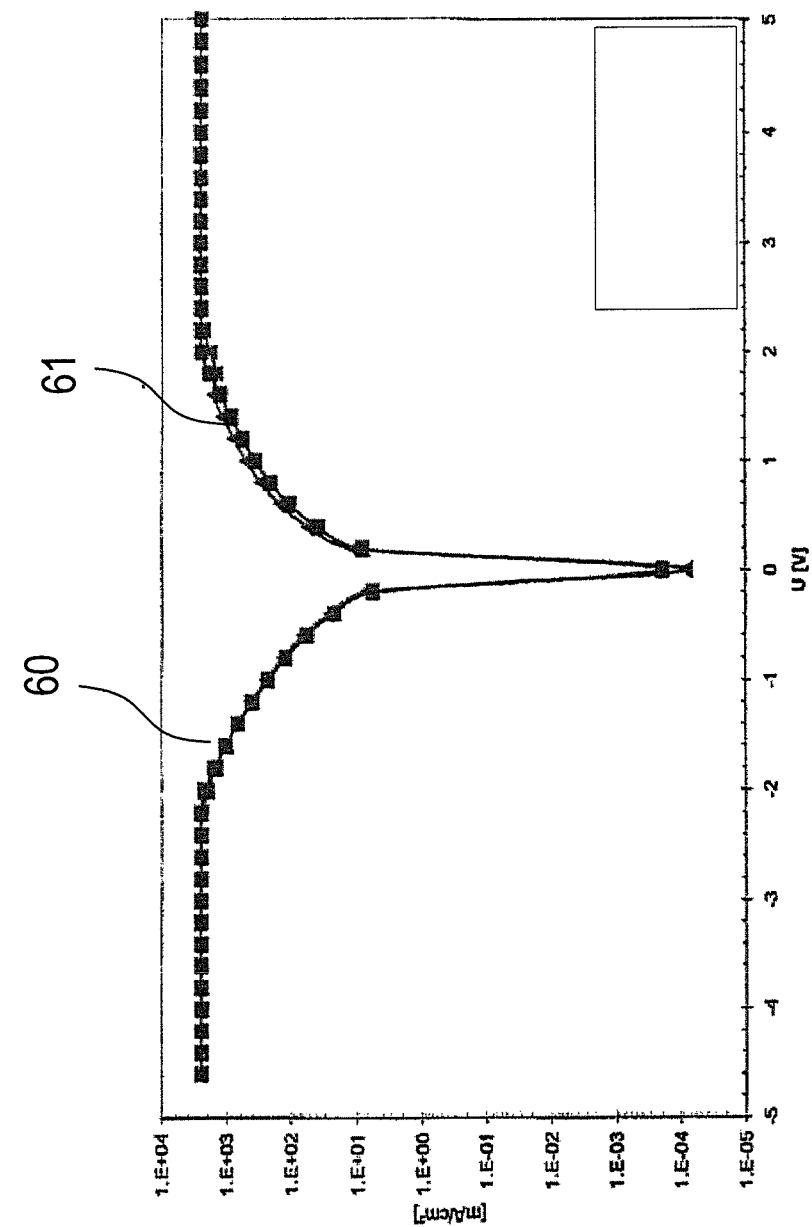
FIG. 7 shows two different current-voltage characteristics at the start and after 66 hours of stressing with 1 mA current for a BCP matrix containing 15% by volume of $Cs_3PO_4$.

FIG. 7 shows current-voltage characteristics of the BCP samples already described in connection with FIG. 5 before and after stressing with a current of 1 mA over 66 hours. In this case, a sample which uses a BCP layer doped with 15% by volume of cesium phosphate arranged between an ITO anode and an aluminum cathode was used. The current-voltage characteristic labeled with reference numeral 61 shows the current-voltage behavior before the stressing with 1 mA, and the current-voltage characteristic labeled 60 the I-U characteristic after the stressing with 1 mA over 66 hours. It is clearly evident that the high current stressing does not lead to any noticeable degradation in the BCP layer, and so it can be assumed that organic electronic devices comprising the electron-transporting region according to the invention have a high lifetime.

FIG. 8 the structure of three organic compounds as usable, for example, in an OLED. The first structural formula shows NPB (N,N'-di(naphthyl-1-yl)-N,N'-diphenylbenzidine), which is suitable, for example, as a hole transport layer and matrix for emitting substances. The second structural formula shows IR(ac) (iridium(III) bis(2-methyldibenzo[f,h]quinoxaline)-(acetylacetonate)). The Ir complex can be used, for example, as a red phosphorescent dye in an OLED. The third structural formula shows TPBI (1,3,5-tris(1-phenyl-1H-benzimidazol-2-yl)benzene), the organic compound III. This compound can be used as a matrix material, inter alia, for the hole-blocking layer and for the electron-conducting layer 3A, 3B.

Figure 9:
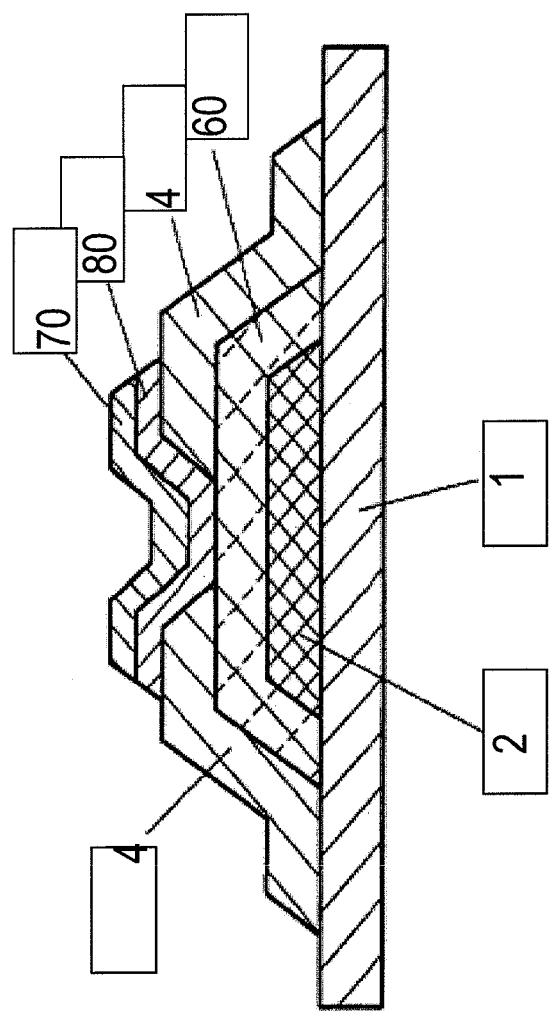
FIG. 9 shows, in schematic cross section, an organic field-effect transistor according to an embodiment of the invention.

FIG. 9 shows, in schematic cross section, a further embodiment of an organic electronic device, which is configured here as an organic field-effect transistor. On the substrate 1 the first electrode 2 is arranged, which is configured as a gate electrode layer. The first electrode 2 is followed by an insulation layer 60, which may comprise, for example, a dielectric. The second electrode 4 is configured as a separate source/drain contact layer. Between the separate source/drain contact layers a semiconductor 80 is arranged comprising a hole-conducting material. The organic field-effect transistor further comprises a top layer 70, which may serve, for example, for encapsulation. The second electrode 4, the separate source/drain contact layers may also include the electron-conducting regions according to the invention and compositions. More particularly, the electron-conducting layer may be arranged on the surface of the electrodes 4 and promote the injection of electrons from these electrodes 4.

Figure 10:
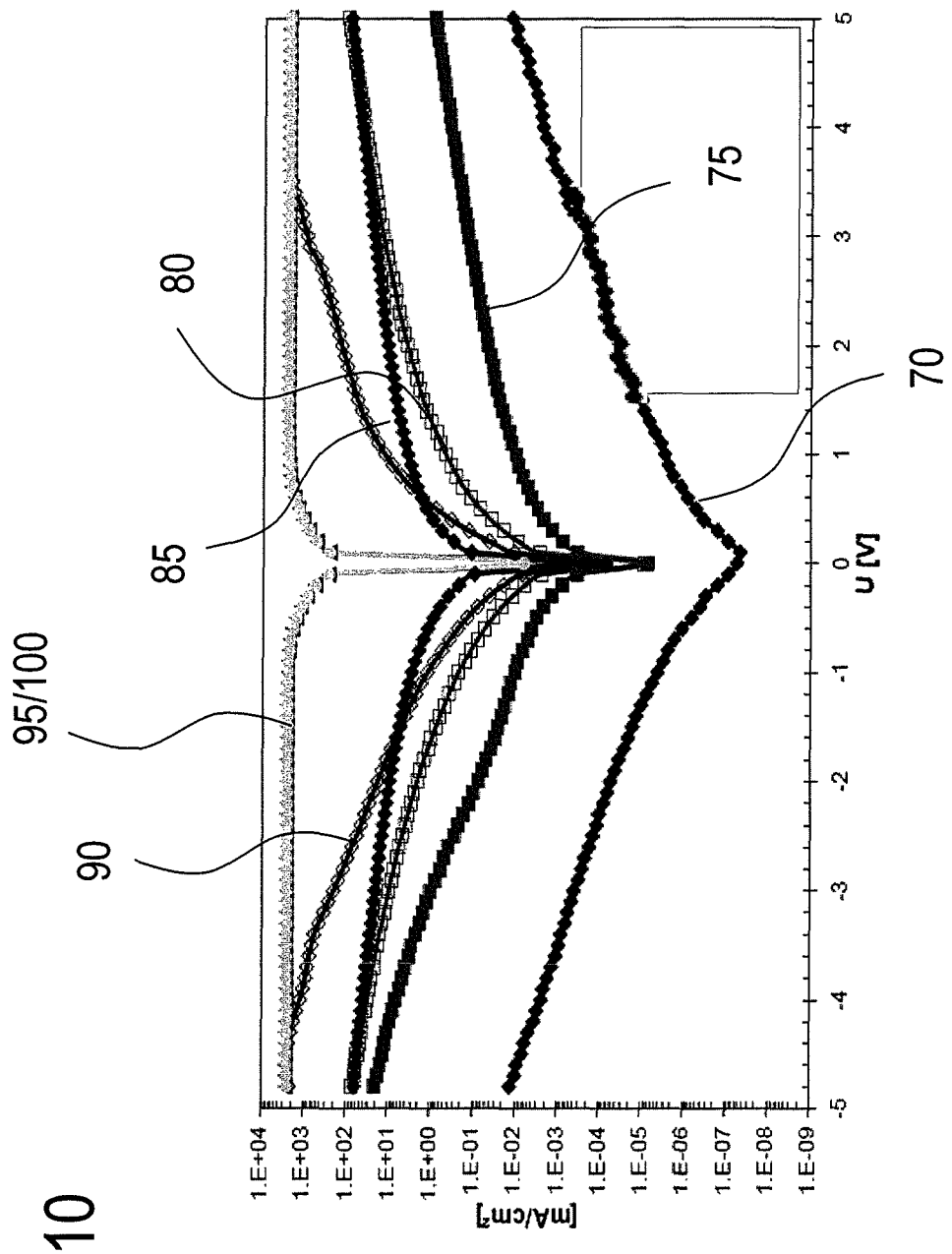
FIG. 10 shows the current-voltage characteristics of an electron-conducting layer, arranged between two electrodes, with different dopant concentrations of the cesium salt of methanetetracarboxylic acid ($Cs_4C_5O_8$) in BCP and other matrix materials.

FIG. 10 shows current-voltage characteristics of devices of analogous structure to the devices already described in connection with FIG. 5. In this case, devices in which different matrix materials were doped with the cesium salt of methanetetracarboxylic acid ($Cs_4C_5O_8$) were produced. As in the case of cesium phosphate too, 200 nm-thick doped layers were deposited here on an ITO layer by means of covaporization, and contacted with an aluminum electrode. This again produced devices with an area of 4 mm$^2$, the current-voltage characteristics of which were analyzed. The matrix materials tested were BCP, and the commercially available materials ETM-033, LG201 (obtainable from LG) and ET7. The current-voltage characteristic labeled 70 shows the current-voltage behavior of a pure BCP layer, while the line labeled 75 indicates doping with 5% by volume of cesium methanetetracarboxylate in BCP. The current-voltage characteristic labeled 80 was measured when doping with 15% by volume of cesium methanetetracarboxylate in BCP was present, and the current-voltage characteristic 85 was obtained in the case of doping of the matrix material ETM-033 with 5% by volume of cesium methanetetracarboxylate. In the case of doping of the matrix material ETM-033 with 15% by volume of cesium methanetetracarboxylate, the I-U characteristic labeled 90 was obtained. The two very similar current-voltage characteristics 95 and 100 indicate the I-U characteristics of LG201 or of an ET7 layer, each doped with 5% by volume of cesium methanetetracarboxylate. The volume concentrations specified are assumptions which were made on the basis of the vaporization rates. The actual concentrations are probably lower, whereas the relative concentration being identical for all matrix materials and hence comparable. The increased concentration certainly also corresponds to the factor of 3. It is therefore, however, also possible that the actual concentrations are, for example, 3% and 9%. The horizontal regions of the characteristics for ET7 and LG201 do not represent a current limitation by the device, but merely represent the current limit of the measuring instrument.

It is clearly evident that the doping with cesium methanetetracarboxylate also results in observation of distinct improvements in the electrical behavior of the electron-conducting layers.

Synthesis of the Cesium Salts of Methanetetracarboxylic Acid and of Methanetricarboxylic Acid:

Under inert conditions, 1 mol of diethyl malonate is added dropwise to 1 mol of freshly prepared sodium ethoxide solution. Thereafter, 1 mol of ethyl chloroformate is added dropwise and the mixture is heated at 50° C. for 1 h. The reaction mixture is then admixed again with 1 mol of freshly prepared sodium ethoxide solution, followed by 1 mol of ethyl chloroformate. Finally, the mixture is heated once again at 50° C. for 1 h and at reflux for 1 h. The reaction mixture is acidified slightly with glacial acetic acid and concentrated down to an oil on a rotary evaporator. The residue is then admixed with water and the tetracarboxylic ester is extracted by means of ether. The dried ether phase is freed completely of the ether on a rotary evaporator and the remaining oil is fractionated under reduced pressure, b.p.: 170° C./12 mbar. The tetraethyl methanetetracarboxylate fraction is stirred with the equivalent amount of cesium hydroxide in water until the two phases of the biphasic mixture have dissolved in one another. The water solvent is completely distilled off on a rotary evaporator and the residue is recrystallized from methanol. The white product which crystallizes is filtered off with suction and, after drying under reduced pressure, is dried in a drain sublimator in an argon stream, vacuum (10-2 mbar) at 300° C. The dried cesium salt of methanetetracarboxylic acid is harvested in a glovebox without prior air exposure (grayish-white powder with a sublimation temperature of >625° C.).

It is also possible analogously to prepare the cesium salt of methanetricarboxylic acid, except that the synthesis is stopped at the first alkylation stage.

The invention is not restricted by the description with reference to working examples. Instead, the invention encompasses every novel feature and every combination of features, which especially includes any combination of features in the claims, even if the feature or this combination itself is not mentioned explicitly in the claims or working examples.

The invention claimed is:

1. An electron-conducting composition comprising:
an electron-conducting matrix material, and
a salt as an n-dopant,
wherein the organic matrix material is selected from materials with a repeating unit with the following general formula:

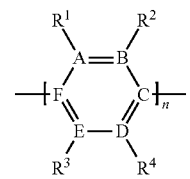

where:
the ring members A to F are each independently C or N, with the proviso that a maximum of two nitrogen atoms may be present, n is an integer from 2 to 8, where the free valences of the ends of the chains of the repeat units may each independently be saturated by H, methyl, phenyl, 2-pyridyl, 3-pyridyl or 4-pyridyl, $R^1$ to $R^4$ may each independently be H, methyl, phenyl, 2-pyridyl, 3-pyridyl or 4-pyridyl, and/or $R^1$ and $R^2$ or $R^3$ and $R^4$ may together form butadiene or azabutadiene units, such that a fused 6-membered ring system is formed and the repeating units may be bonded by ethylene or azomethine units between the $n^{th}$ and $(n+1)^{th}$ ring to form phenanthrene or azaphenanthrene units, or wherein the organic matrix material is selected from the following compounds:
2,2',2"-(1,3,5-benzenetriyl)tris(1-phenyl-1Hbenzimidazole),
2-(4-biphenylyl)-5-(4-tert-butylphenyl)-1,3,4-oxadiazole,
2,9-dimethyl-4,7-diphenyl-1,10-phenanthroline (BCP),
4-(naphthalen-1-yl)-3,5-diphenyl-4H-1,2,4-triazole,
1,3-bis[2-(2,2'-bipyridin-6-yl)-1,3,4-oxadiazo-5-yl]benzene,
4,7-diphenyl-1,10-phenanthroline,
3-(4-biphenylyl)-4-phenyl-5-tert-butylphenyl-1,2,4-triazole,
6,6'-bis[5-biphenyl-4-yl)-1,3,4-oxadiazo-2-yl]-2,2'-bipyridyl,
2-phenyl-9,10-di(naphthalen-2-yl)anthracene,
2,7-bis[2-(2,2'-bipyridin-6-yl)-1,3,4-oxadiazo-5-yl]-9,9-dimethylfluorene,
1,3-bis[2-(4-tert-butylphenyl)-1,3,4-oxadiazo-5-yl)benzene,
2-(naphthalen-2-yl)-4,7-diphenyl-1,10-phenanthroline,
2,9-bis(naphthalen-2-yl)-4,7-diphenyl-1,10-phenanthroline,
tris(2,4,6-trimethyl-3-(pyridin-3-yl)phenyl)borane,
1-methyl-2-(4-(naphthalen-2-yl)phenyl)-1H-imidazo[4,5-f][1,10]-phenanthroline,
siloles with silacyclopentadiene units, and wherein said salt consists of:
a metal cation selected from the group consisting of monovalent metal cations $Rb^+$, $Cs^+$, $Ag^+$, $Cu^+$, $Tl^+$, alkaline-earth metal cations, and combinations thereof, and
at least one anion, of at least threefold negative valence, selected from the group consisting of: phosphate anions $PO_4^{3-}$ and anionic polyvalent organic anions.

2. An organic electronic device comprising:
a substrate;
a first electrode;
a second electrode; and
an electron-conducting region which is arranged between the first and second electrodes and comprises:
an organic matrix material and a salt,
wherein the organic matrix material is selected from materials with a repeating unit with the following general formula:

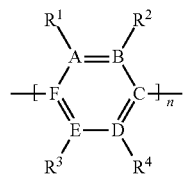

where:
the ring members A to F are each independently C or N, with the proviso that a maximum of two nitrogen atoms may be present,
n is an integer from 2 to 8, where the free valences of the ends of the chains of the repeat units may each independently be saturated by H, methyl, phenyl, 2-pyridyl, 3-pyridyl or 4-pyridyl, $R^1$ to $R^4$ may each independently be H, methyl, phenyl, 2-pyridyl, 3-pyridyl or 4-pyridyl, and/or $R^1$ and $R^2$ or $R^3$ and $R^4$ may together form butadiene or azabutadiene units, such that a fused 6-membered ring system is foinied and the repeating units may be bonded by ethylene or azomethine units between the $n^{th}$ and $(n+1)^{th}$ ring to form phenanthrene or azaphenanthrene units, or wherein the organic matrix material is selected from the following compounds:
2,2',2"-(1,3,5-benzenetriyl)tris(1-phenyl-1Hbenzimidazole),
2-(4-biphenylyl)-5-(4-tert-butylphenyl)-1,3,4-oxadiazole,
2,9-dimethyl-4,7-diphenyl-1,10-phenanthroline (BCP),
4-(naphthalen-1-yl)-3,5-diphenyl-4H-1,2,4-triazole,
1,3-bis[2-(2,2'-bipyridin-6-yl)-1,3,4-oxadiazo-5-yl]benzene,
4,7-diphenyl-1,10-phenanthroline,
3-(4-biphenylyl)-4-phenyl-5-tert-butylphenyl-1,2,4-triazole,
6,6'-bis[5-biphenyl-4-yl)-1,3,4-oxadiazo-2-yl]-2,2'-bipyridyl,
2-phenyl-9,10-di(naphthalen-2-yl)anthracene,
2,7-bis[2-(2,2'-bipyridin-6-yl)-1,3,4-oxadiazo-5-yl]-9,9-dimethylfluorene,
1,3-bis[2-(4-tert-butylphenyl)-1,3,4-oxadiazo-5-yl)benzene,
2-(naphthalen-2-yl)-4,7-diphenyl-1,10-phenanthroline,
2,9-bis(naphthalen-2-yl)-4,7-diphenyl-1,10-phenanthroline,
tris(2,4,6-trimethyl-3-(pyridin-3-yl)phenyl)borane,
1-methyl-2-(4-(naphthalen-2-yl)phenyl)-1H-imidazo[4,5-f][1,10]-phenanthroline,
siloles with silacyclopentadiene units, and wherein the salt consists of:
a metal cation selected from the group consisting of monovalent metal cations $Rb^+$, $Cs^+$, $Ag^+$, $Cu^+$, $Tl^+$, alkaline-earth metal cations, and combinations thereof, and
at least one anion, of at least threefold negative valence, selected from the group consisting of: phosphate anions $PO_4^{3-}$ and anionic polyvalent organic anions.

3. The electronic device according to claim 2, wherein the electron-conducting region comprises an electron-conducting layer which comprises the organic matrix material and in which the salt has been introduced as an n-dopant.

4. The electronic device according to claim 3, wherein the n-dopant is present in the organic matrix material in a concentration of 1 to 50% by volume.

5. The electronic device according to claim 3, wherein the salt is coordinated to the organic matrix material via the metal cation.

6. The electronic device according to claim 3, wherein a coordination compound between the metal cation and the organic matrix material is present in the electron-conducting layer, into which compound the anion has been intercalated.

7. The electronic device according to claim 3, wherein the electron-conducting layer is obtainable by covaporization of a salt of the anion and of the metal cation with the organic matrix material.

8. The electronic device according to claim 2, wherein the organic matrix material comprises a heterocyclic nitrogen containing compound.

9. The electronic device according to claim 2, wherein the organic matrix material is selected from:

I
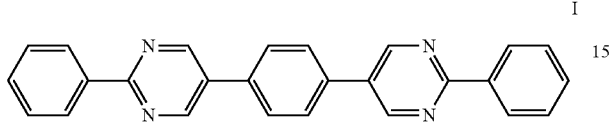

II
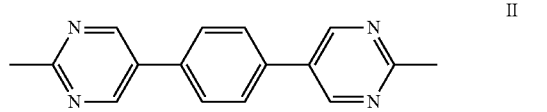

III
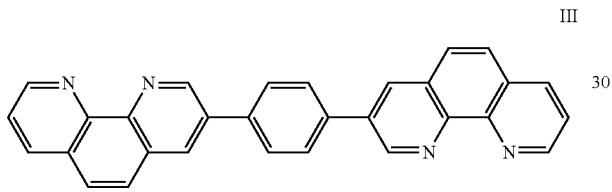

IV
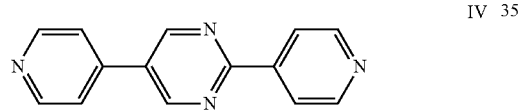

V
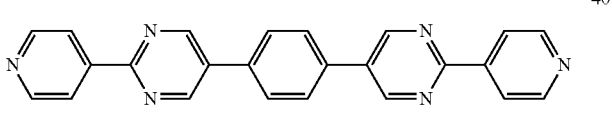

VI
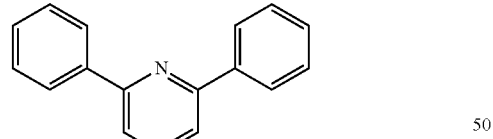

VII
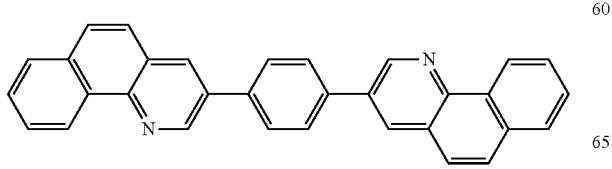

-continued

VIII
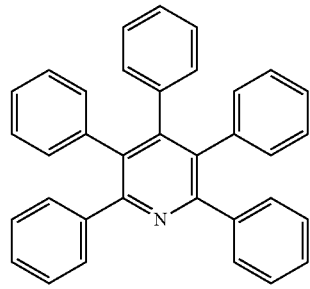

IX
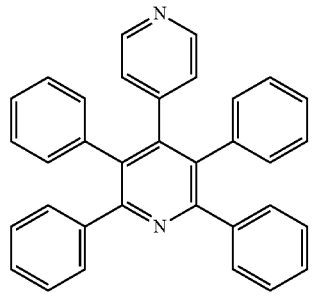

X
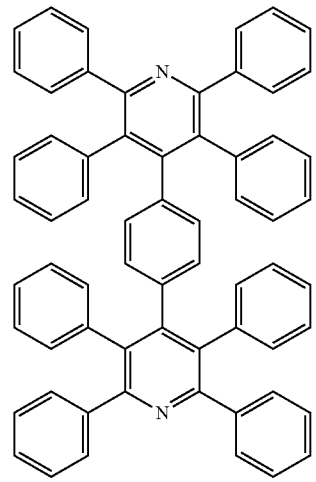

XI
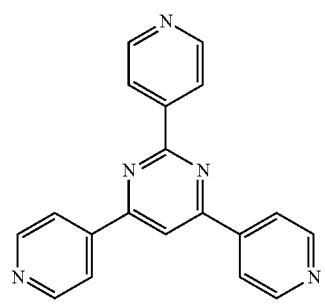

-continued

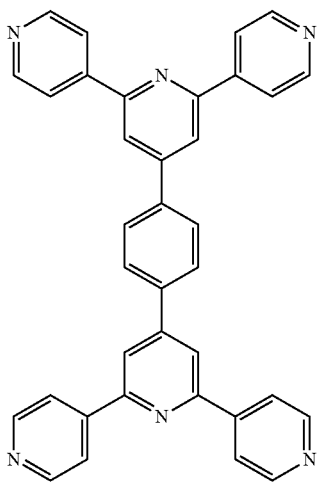

or combinations thereof.

10. The electronic device according to claim 2, in the form of an organic electroluminescent device, further comprising an organic electroluminescent layer between the electron-conducting region and one of the electrodes.

11. The electronic device according to claim 2, in the form of an organic photosensitive device, further comprising an organic photoactive layer between the electron-conducting region and one of the electrodes.

12. A process for producing an organic electronic device according to claim 2, comprising the process steps of:

A) providing a substrate with a first electrode;

B) applying an electron-conducting region to the first electrode;

C) applying a second electrode in electrically conductive contact with the electron-conducting region;

wherein the electron-conducting region is applied by vaporizing the organic matrix material and the salt.

\* \* \* \* \*

UNITED STATES PATENT AND TRADEMARK OFFICE
CERTIFICATE OF CORRECTION

| | | |
|---|---|---|
| PATENT NO. | : 9,520,570 B2 | Page 1 of 1 |
| APPLICATION NO. | : 13/499542 | |
| DATED | : December 13, 2016 | |
| INVENTOR(S) | : Guenter Schmid et al. | |

It is certified that error appears in the above-identified patent and that said Letters Patent is hereby corrected as shown below:

On the Title Page

In Item (75) Inventors, change "Jan Hauke Wemken, Nuremberg, (DE)" to --Jan Hauke Wemken, Nürnberg, (DE)--.

In the Claims

In Claim 2, at Column 14, Line 13, change "foinied" to --formed--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*